United States Patent [19]

Matsumura et al.

[11] Patent Number: 4,742,012

[45] Date of Patent: May 3, 1988

[54] METHOD OF MAKING GRADED JUNCTION CONTAINING AMORPHOUS SEMICONDUCTOR DEVICE

[75] Inventors: Mitsuo Matsumura, Kasukabe; Hideo Yamamoto; Keitaro Fukui; Toshihiro Yoshida; Yoshinobu Okayasu; Kunio Asai, all of Ohi; Osamu Nakamura, Tokyo, all of Japan

[73] Assignee: Toa Nenryo Kogyo K.K., Tokyo, Japan

[21] Appl. No.: 948,419

[22] Filed: Dec. 30, 1986

Related U.S. Application Data

[63] Continuation-in-part of Ser. No. 675,362, Nov. 27, 1984, abandoned.

[51] Int. Cl.⁴ .................................... H01L 31/18
[52] U.S. Cl. ........................... 437/4; 437/101; 437/110; 136/258; 427/39; 357/30; 118/719; 118/723
[58] Field of Search ............... 427/39, 74, 86; 148/174; 136/258 AM; 357/30 F,30 J,30 K, 59 C; 437/4, 101, 110

[56] References Cited

U.S. PATENT DOCUMENTS

| | | | |
|---|---|---|---|
| 4,490,208 | 12/1984 | Tanaka et al. | 156/606 |
| 4,576,830 | 3/1986 | Kiss | 427/39 |

FOREIGN PATENT DOCUMENTS

| | | | |
|---|---|---|---|
| 58-132983 | 8/1983 | Japan | 136/258 AM |
| 59-25278 | 2/1984 | Japan . | |
| 59-52883 | 3/1984 | Japan | 136/258 AM |
| 59-125618 | 7/1984 | Japan . | |
| 59-229878 | 12/1984 | Japan | 258 AM/ |

*Primary Examiner*—Aaron Weisstuch
*Attorney, Agent, or Firm*—Sughrue, Mion, Zinn, Macpeak, and Seas

[57] ABSTRACT

This invention discloses a new semiconductor device having no step type p-i-n juctions but rather has a graded p-i-n juction. The semiconductor device shows a high photoelectric conversion efficiency, and since said device can be produced easily with good reproducibility by a plasma discharge method, it is especially suited for use as a solar battery. An apparatus for the production of said semiconductor device is also disclosed.

6 Claims, 2 Drawing Sheets

METHOD OF MAKING GRADED JUNCTION CONTAINING AMORPHOUS SEMICONDUCTOR DEVICE

This is a continuation-in-part, of application Ser. No. 675,362, filed Nov. 27, 1984, and now abandoned.

FIELD OF THE INVENTION

This invention relates to a novel amorphous semiconductor device. More particularly, it relates to a novel amorphous semiconductor device especially useful as a solar battery, and a method and an apparatus for producing such an amorphous semiconductor device.

BACKGROUND OF THE INVENTION

Amorphous solar batteries having p-i-n junctions have been noted with keen interest for their extremely low production cost compared to single crystal solar batteries, and such amorphous solar batteries are lately considered the most hopeful of all types of solar batteries.

In the conventional amorphous solar batteries, the p-i-n junction (abbreviated as pin junction), that is, the junctions at the p/i and i/n interfaces had an abrupt step configuration. The solar batteries having such step type pin junctions have been produced mostly by using the glow-discharge plasma decomposition technique, and the P, i and n layers have been formed one after another in different film forming chambers separated from each other by means of valves, gas curtains, or forced gas discharges. Thus, for the production of the step type pin junction devices, it has been considered essential to keep the i layer free of any impurities.

However, according to the conventional separated three-chamber system, since the respective chambers for forming the p, i and n layers were separated from each other by valves or other means mentioned above, much time was required for the transfer of the workpieces from chamber to chamber, thus posing a problem with respect to productivity. Also, since substrate holders are moved successively through the three chambers, there would take place the re-release of dopant elements from the films adhering to the substrate holders in the course of said movement, resulting in a wide scatter in quality of the junction devices produced according to this method.

As a result of detailed studies for eliminating these drawbacks of the prior art, the present inventors have found that an amorphous semiconductor device having no distinct delineations of the p/i and i/n interfaces and having a freely controllable potential profile can be obtained without having any step type pin junctions where the dopant concentration is not changed abruptly stepwise but by introducing gradual changes in the dopant concentration, and such an amorphous semiconductor device (hereinafter referred to as a graded junction device) can function well as a solar battery. The present invention was achieved on the basis of this finding.

The first object of this invention, therefore, is to provide an amorphous semiconductor device which is easy to produce.

The second object of this invention is to provide a novel graded junction amorphous solar battery which involves no "junction" of the conventional conception.

The third object of this invention is to provide a method for producing the graded junction device with ease.

The fourth object of this invention is to provide an apparatus for producing the graded junction device.

DISCLOSURE OF THE INVENTION

The present invention pertains to an amorphous semiconductor device characterized by possessing graded junctions in which the p-type dopant concentration changes monotonously from the p layer to the i layer and the n-type dopant concentration changes monotonously from the i layer to the n layer, and a method and an apparatus for producing such a novel amorphous semiconductor element.

The terms "p layer", "n layer" and "i layer" used in this invention mean a p-type semiconductor layer, an n-type semiconductor layer, and an intrinsic layer (i-layer) which contains no dopant. The term "pin junction" of this specification means a junction in which a distinct change of dopant concentration is observed but the changes at the interfaces of said p and i regions and said i and n regions occur not stepwise but continuously, hence no definite boundaries exist at the p/i and i/n interfaces, so that the product of this invention does not come within the category of the conventional "semiconductor devices having pin junctions" in the strict sense of the words.

In general, the thickness of the p-layer is about 100 Å to 200 Å, and about 200 Å to 400 Å in the case of the n-layer, while the active layer would have a thickness of about 4,000 to 5,000 Å. The thickness of the i-layer is controlled by selecting the deposition conditions, which in turn will depend upon apparatus design.

Generally, in an amorphous silicon solar battery, the life time of a hole or an electron produced in a p-layer or an n-layer by absorption of light is very short. Therefore, both the p-layer and the n-layer are inactive for producing carriers which contribute to a photocurrent. However, in the case of the above mentioned interfaces of the present invention they are able to function as active layers in addition to the i-layer, since the life times of the holes and the electrons produced in said interfaces are long and thus these charge carriers can contribute to the photocurrent. Namely, by using the amorphous semiconductor device of the present invention, characteristics of the amorphous silicon solar battery can be improved, since not only the i-layer but also said interfaces function as part of the active layer.

The principle for the production of a graded junction device of this invention is very simple; the device can be produced by using the generally known glow-discharge plasma decomposition technique by controlling the dopant gas concentration during film formation with relation to time and/or under positional adjustment.

The glow-discharge plasma decomposition technique employed in the present invention is a process in which the feedstock gas, with the dopant gas if necessary, is fed to a reaction chamber under reduced pressure and the gas is brought into a plasma state by high-frequency discharge, low-frequency discharge, or DC discharge to effect decomposition of the gas in the reaction chamber to form a semiconductor film on the substrate.

The gas pressure in the reaction chamber differs depending on the type of the gas used, but in the present invention, any pressure range that can produce a uniform electric discharge in relation to the electrodes and the applied voltage can be used. In the present invention, the pressure range is 0.01 to 10 Torr, preferably 0.05 to 2 Torr, and more preferably 0.3 to 0.6 Torr.

As the feedstock gas used in this invention, any type of gas generally employed for producing semiconductors according to the glow-discharge plasma decomposition method can be used, among which silanes represented by the formula $Si_nH_{2n+2}$ and silane derivatives such as represented by the formula $Si_nX_mH_{2n+2-m}$ (X being a halogen atom), or mixtures thereof, are preferred. In the reaction chamber, a gas for adjusting the film quality, such as a rare gas or hydrogen gas, may be introduced.

The dopant gas used in the present invention should be a gaseous compound of Group III elements of the Periodic Table in the case of producing a p-type semiconductor film and a gaseous compound of Group V elements of the Periodic Table in the case of producing an n-type semiconductor film.

Among the above-mentioned dopant gases, a hydrogen compound is most preferred as it is best suited for uniformalizing the performance of the films produced under the fixed reaction conditions during plasma discharge.

For the sequential control of the dopant concentration in the semiconductor film in the process of this invention, it is necessary to employ a flow system in which the gas in the film forming chamber is pumped out while simultaneously supplying a fresh gas by maintaining the gas pressure in the film forming chamber at a level which enables electric discharge. This flow system may not necessarily be a continuous gas flow system; it merely requires that the gas in the reaction chamber be replaced in given amounts discontinuously at given time intervals.

More definitely, the process can be carried out according to two different methods. In one method, the dopant gas in the film forming chamber is controlled in both quantity and species in relation to time by the above mentioned means. In another method, the dopant gas is controlled so that its amount and species differ according to the position in the film forming chamber, and the substrates are moved successively in this film forming chamber to form a semiconductor film on each substrate.

In a typical example of the first method, a dopant gas is completely mixed with silane and a p-layer or n-layer is formed on a substrate by discharge. After decreasing the dopant gas to zero with time and then introducing another dopant gas and increasing the second dopant gas concentration with time, an active layer including an i-layer not containing any dopant is first formed and then n-layer or p-layer is formed. This method is not suitable for mass production.

The second method is capable of continuous production of semiconductors and therefore is preferred for the commercial-scale production of semiconductors.

DESCRIPTION OF THE MOST PREFERRED EMBODIMENTS

Now, the apparatus for producing the graded junction device according to this invention will be described with reference to the accompanying drawings.

Figure 1:
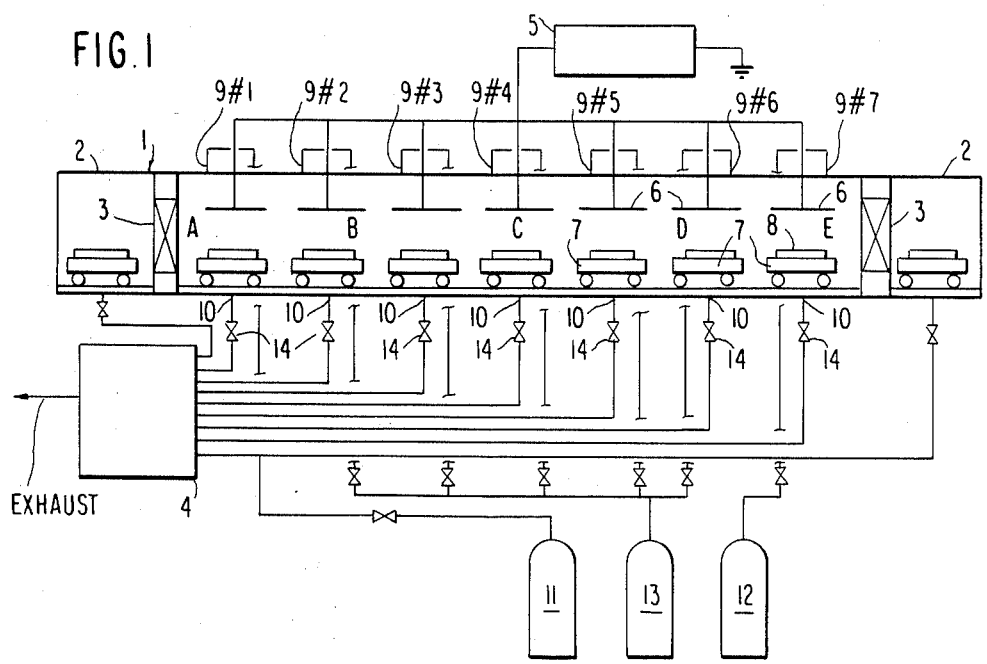
FIG. 1 is a schematic illustration of a typical example of the apparatus for producing the graded junction element according to this invention.

FIG. 1 illustrates an apparatus for producing the graded junction device according to this invention.

In the drawing, numeral 1 indicates a film forming chamber connected to preparatory vacuum chambers 2 through separating valves 3. Numeral 6 refers to cathode electrodes provided in the film forming chamber. A plurality of separate cathode electrodes may be provided in any desired number as shown in the drawing. A corresponding number of movable anode electrodes 7, each carrying a substrate 8, are also positioned in the film forming chamber.

Numeral 5 denotes a power source for electric discharge. It may, for instance, be a high-frequency oscillator. Numeral 4 is a vacuum system. Numerals 11 to 13 designate gas cylinders, in which, for example, 11 is a dopant gas cylinder for forming a p-type semiconductor film, 12 a dopant gas cylinder for forming an n-type semiconductor film and 13 a feedstock gas cylinder for forming the i layer. Gas discharge is adjusted by valves 14.

A typical method for producing the graded junction device of this invention by using the apparatus of this invention will now be described.

A substrate 8 is placed on each of the anode electrodes 7 in the preparatory chambers 2 and said chambers 2 are evacuated by a vacuum system 4. The gases are supplied into the film forming chamber 1, which has been evacuated by the vacuum system 4, from the respective gas feed inlets 9 as follows: $B_2H_6$, which was 0.2% of the $SiH_4$, was supplied from the first feed inlet at a flow rate of 20 SCCM (where SCCM indicates the volume (cm$^3$) of a gas flowing in the period of one minute under standard conditions) and $SiH_4$ was supplied from the second to sixth feed inlets at a flow rate of 20 SCCM while $PH_3$, which was 0.4% of the $SiH_4$, was supplied from the seventh feed inlet at a flow rate of 10 SCCM. A voltage is applied between each cathode and anode pair from the power source 5 to start electric discharge. Each gas is supplied into the film forming chamber through a flowmeter and a microadjusting valve such as needle valve, and the gas in the film forming chamber is exhausted from the gas outlets 10 through an exhaust system.

Then the separating valves 3 are opened and the substrate-carrying anode electrodes in the preparatory chambers are moved into the film forming chamber to come to the positions indicated by the letters A–E, forming the graded junction elements of this invention.

The photoelectric conversion efficiency of the semiconductor device obtained in this embodiment of the invention, when measured under AMI irradiation, was 7.3%, which indicates usefulness of these semiconductor devices for a solar battery.

Continuous production of semiconductors is possible by arranging the anode electrodes successively at given intervals in the manner of a belt conveyor.

Figure 3:
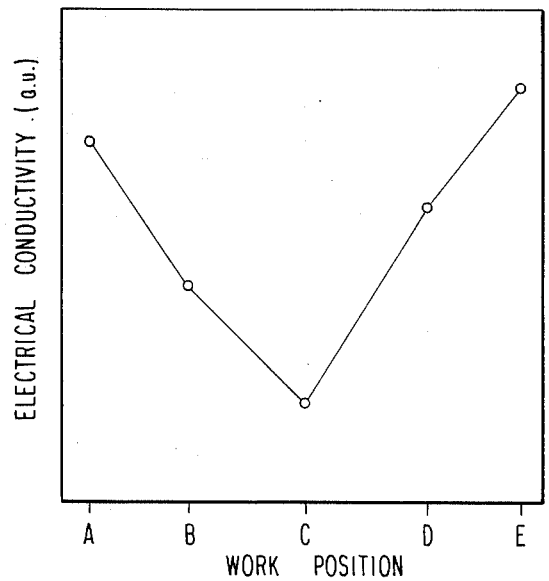
FIG. 3 is a graph showing the relation ship between the electrical conductance of the deposited semiconductors and workpiece positions when the semiconductors were produced by using the apparatus of FIG. 1 by fixing the anode electrodes at positions of A, B, C, D and E, respectively.
Figure 4:
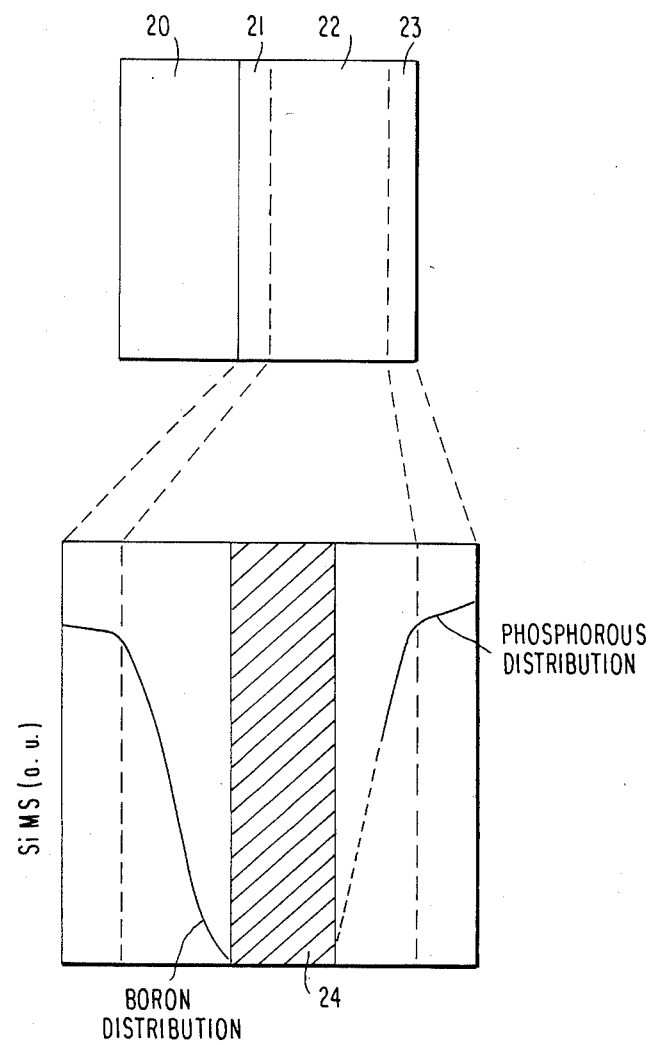
FIG. 4 illustrates the graded junction element according to this invention and the concentration distributions of boron and phosphorus composing the dopant gas in the element. In the drawing, reference numeral 20 indicates a stainless steel substrate, 21 a p layer, 22 an active layer, 24 an i layer, and 23 an n layer. "SIMS signal" indicates the element concentrations as determined by a secondary ion mass spectrograph, and a.u. stands for arbitrary unit.

In the case where the substrate-carrying anode electrodes are not moved but are fixed at the sites A to E, p-type semiconductors can be obtained at the sites A and B and n-type semiconductors at the sites D and E. The electrical conductivity of the films obtained at the sites A to E was as shown in FIG. 3. These results suggest that in case of moving the substrate from A to E, the dopant elements in the obtained film are distributed with a continuous concentration gradient as shown in FIG. 4.

Figure 2:
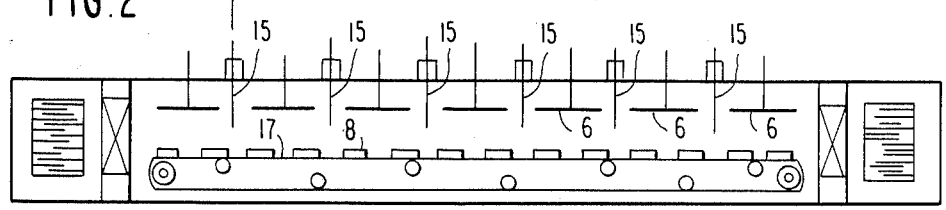
FIG. 2 illustrates another embodiment of film forming chamber according to this invention.

The anode electrode used in the apparatus of this invention may be a single continuous plate, and accordingly the substrates used in this invention can be moved by a belt conveyor system as shown in FIG. 2. In FIG. 2 of the drawing, reference numeral 6 denotes cathode electrodes, 17 denotes a belt-like anode electrode, 8 denotes substrates and 15 baffle plates arranged vertically movable.

The gas feed into the film forming chamber can be controlled as desired by adjusting various valves provided in the apparatus of this invention. Such control can be further facilitated by providing a baffle plate between adjoining gas feed inlets as shown in FIG. 2, said baffle plate being arranged vertically movable to control the gas flow.

The size and other structural details of the semiconductor producing apparatus of this invention and its component parts, such as the size of the film forming chamber and preparatory chambers, the position, size and number of the gas feed inlets, gas outlets and baffle plates, the type of valves and exhaust system, etc., can be properly designed to best meet the desired size, moving rate and other requirements of the semiconductor films to be produced.

EXAMPLE

The following experiments were carried out using the apparatus as depicted in FIG. 1 of the drawing. A substrate 8, which was heated at 250° C., was placed on each of the anode electrodes 7 in the preparatory chambers 2 and said chambers 2 are evacuated by a vacuum system 4. The gases are supplied into the film forming chamber 1, which has been evacuated by the vacuum system 4, from the respective gas feed inlets 9 as follows: $B_2H_6$, which was 0.2% of $SiH_4$, was supplied from the first feed inlet at a flow rate of 20 SCCM (where SCCM indicates the volume ($cm^3$) of a gas flowing in the period of one minute under standard conditions) and $SiH_4$ was supplied from the second to sixth feed inlets at a flow rate of 20 SCCM while $PH_3$, which was 0.4% of $SiH_4$, was supplied from the seventh feed inlet at a flow rate of 10 SCCM.

A voltage was applied between each pair of cathode and anode from the power source 5 to start electric discharge and maintained a discharge density at 0.03 W/cm$^2$. Each gas was supplied into the film forming chamber through a flowmeter and a micro-adjusting valve, and the gas in the film forming chamber was exhausted from the gas outlets 10 through an exhaust system. In this case, valves 14 were adjusted so that the pressure around the outlets of first and seventh chambers was maintained at 250 m Torr and the pressure around outlets of from second to sixth chambers was maintained at 300 m Torr.

Then the separating valves 3 were opened and the substrate-carrying anode electrodes in the preparatory chambers were moved from one separating valve to another separating valve at a velocity of about 4.5 cm/min to form the graded junction elements of this invention. The distance between each separating valve was 2.5 m.

Under the conditions of this example, and as confirmed by impurity concentration analysis of the semiconductor device using Secondary Ion Mass Spectorscope manufactured by VG Scientific Company Limited, a p-, i- and n-structure is obtained in which an internal i-layer does not contain any dopant.

POSSIBILITY OF INDUSTRIAL USES

The process of this invention is very simple as the desired semiconductors can be produced by merely controlling the feedstock gas and/or dopant gas. Also, since the process can dispense with separating valves and other complicated mechanisms, the process has no possibility of causing any fatal operational trouble for the production of semiconductors. Further, the apparatus itself can be simplified in structure to provide an economic advantage. The pin solar cell obtained by this invention that can be produced easily and economically as described above shows a high photoelectric conversion efficiency and, in view of its economic merit, it is especially suited for use as a solar battery.

What is claimed is:

1. In a method to produce an amorphous P-I-N or N-I-P junction by a plasma decomposition technique, the improvement comprising using an apparatus having a single film forming chamber which is so designed that a dopant gas concentration can be controlled according to a position in the chamber and forming on a base plate a p-type layer or a n-type layer containing a dopant impurity continuously decreasing to zero, then forming an i-type layer containing no dopant impurity on said p-type layer n-type layer and then forming on the i-type layer the other of said n-type layer or p-type layer containing dopant impurity continuously increasing from zero to a predetermined amount continuously to form a graded P-I-N or N-I-P junction amorphous semiconductor device, in which process the layer is changed by controlling the concentration of each respective dopant in a raw gas, the dopant concentration in the raw material gas varying as a function of position in the chamber.

2. A method as claimed in claim 1, wherein said apparatus has a plurality of feedstock gas supply ports and a plurality of gas discharge ports in the film forming chamber to continuously control the distribution of the dopant gas concentration.

3. A method as claimed in claims 1 or 2, wherein said apparatus has a plurality of baffle plates in the film forming chamber to control the distribution of the dopant gas concentration.

4. A method as claimed in claim 3, wherein said baffle plates are provided transverse to the direction of gas flow.

5. A method as claimed in claim 1, wherein the pressure in the chamber is maintained at a constant pressure selected from a pressure range of 0.01 torr to 10 torr.

6. A method as claimed in claim 5, wherein a hydrogen compound is used as the dopant gas.

* * * * *